US007028280B1

(12) United States Patent
Liu et al.

(10) Patent No.: US 7,028,280 B1
(45) Date of Patent: Apr. 11, 2006

(54) IC LAYOUT BUFFER INSERTION METHOD

(75) Inventors: I-Min Liu, Cupertino, CA (US); Wei-Lun Kao, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 627 days.

(21) Appl. No.: 10/183,334

(22) Filed: Jun. 26, 2002

(51) Int. Cl.
*G06F 17/50* (2006.01)

(52) U.S. Cl. .................. 716/8; 716/12; 716/2

(58) Field of Classification Search ............. 716/2, 716/5–6, 8, 10–12
See application file for complete search history.

(56) References Cited

U.S. PATENT DOCUMENTS

| | | | |
|---|---|---|---|
| 6,412,101 B1 * | 6/2002 | Chang et al. ............. | 716/10 |
| 6,425,114 B1 * | 7/2002 | Chan et al. ............. | 716/6 |
| 6,510,542 B1 * | 1/2003 | Kojima ................. | 716/10 |
| 6,581,199 B1 * | 6/2003 | Tanaka ................ | 716/11 |
| 2002/0162086 A1 * | 10/2002 | Morgan ................ | 716/18 |
| 2003/0163795 A1 * | 8/2003 | Morgan et al. .......... | 716/10 |

* cited by examiner

*Primary Examiner*—Stacy A Whitmore
(74) *Attorney, Agent, or Firm*—Rosenberg, Klein & Lee

(57) ABSTRACT

An integrated circuit (IC) layout system designs nets for interconnecting cells forming modules of a hierarchical IC design. Each module is defined as having one or more ports through which the nets extend when linking cells forming different modules. The layout system automatically inserts buffers into selected segments of the nets to reduce signal path delays through the nets and assigns the inserted buffers to selected modules. However the layout system inserts buffers only into those net segments for which a buffer insertion would not alter the number of ports any module needs to accommodate the net.

24 Claims, 8 Drawing Sheets

IC LAYOUT BUFFER INSERTION METHOD

BACKGROUND OF THE INVENTION

1. Field of the Invention

The present invention relates in general to computer-aided design (CAD) tools for producing layouts based on modular integrated circuit (IC) designs, and in particular to a method for determining whether a buffer inserted by a CAD tool into any signal path within an IC layout will alter the ports of any module of the IC.

2. Description of Related Art

FIG. 1 is a data flow diagram illustrating an integrated circuit design process in which an IC designer initially generates a register transfer language (RTL) netlist 1 describing an IC as a set logic blocks linked though signal paths ("nets"). An RTL netlist 1 often describes the logic blocks somewhat abstractly, using mathematical statements to define the boolean logic they are to carry out. However after having created RTL netlist 1, the designer may employ a synthesis tool 2 to convert the RTL level netlist into a "gate level" netlist 4 describing the logic blocks more concretely by referencing the particular circuit devices that are to implement the logic.

As illustrated in FIG. 2, the gate level netlist 4 of FIG. 1 typically organizes the IC design 10 into a hierarchy of interconnected leaf cells 12 and modules 14. The leaf cells 12, represented by small circles in FIG. 1, are standard circuit components described by entries in a cell library 3 (FIG. 1). Thus rather than directly describing each leaf cell 12, gate level netlist 4 indirectly describes the cell by referencing its corresponding entry in cell library 3. Leaf cells 12 may range from small standard circuit components such as individual transistors and logic gates, up to very large components such random access memories and microprocessors. Gate level netlist 3 organizes the cells 12 forming the IC into a hierarchy of modules 14 with each module 14 residing at any given level of the design hierarchy being formed by a set of interconnected leaf cells and/or modules residing at a next lower level of the hierarchy.

Although gate level netlist 4 identifies the cells forming the IC and names the nets that carry signals between their terminals, it does not describe how the components are to be arranged in a semiconductor substrate and does not indicate how the nets that interconnect them are to be implemented within the substrate. Therefore, after creating gate level netlist 4, the designer uses a layout tool 5 (FIG. 1) to generate a layout 6 for the IC design described by gate level netlist 4. Layout 6 describes how and where each cell is to be formed in a semiconductor substrate and indicates how the nets interconnecting them are to be formed and routed. Layout tool 5 consults cell library 3 to determine the size, shape and internal layout of each leaf cell. As it designs the nets interconnecting cell terminals, layout tool 5 tries to satisfy various constraints 7 the designer places on cell placement and path routing. Layout "tool" 5 may be implemented as a collection of separate tools for carrying out all the various procedures needed to convert a gate level netlist 4 into IC layout 6 in a manner that satisfies constraints 7 including, for example, tools for floor planning, placement and routing, clock tree synthesis, and timing analysis.

During the design process, the designer employs simulation and verification tools 11 to check the IC design specified by RTL and gate level netlists 1 and 4 to determine whether they describe an IC, or selected modules thereof will behave as expected. After layout tool 5 generates IC layout 6, a netlist compiler 8 processes layout 6 to produce another "layout level" netlist 9 modeling the circuit as a set of library cells interconnected by the nets designed by layout tool 5. The inclusion of behavioral models of the nets renders layout level netlist 9 a more accurate model of the behavior of the IC than RTL and gate level netlists 1 and 4. The designer may again employ simulation and verification tools 11 to determine whether the IC the layout level netlist 9 describes will behave as expected.

RTL level and gate level netlists 1 and 4 IC usually describe an IC as a modular hierarchy because the designer usually finds a hierarchical IC design easier to comprehend and manipulate than a "flat" design consisting only of interconnected leaf cells that are not organized into modules. A designer often creates, simulates and verifies each module separately before assembling them into the full netlist description of the IC.

However a typical layout tool 5 ignores the modular, hierarchical nature of the IC design described by gate level netlist 4 and places each leaf cell without regard to its position in the modular design hierarchy. Thus leaf cells forming separate modules can be intermingled to some extent within layout 6. The layout level netlist 8 derived from flat layout 6 therefore typically describes a flat IC design, rather than a hierarchical IC design. The loss of modularity of the layout level netlist version of the IC design makes it difficult for the designer to separately simulate or verify the behavior of each module of the design because the modules no longer exist as identifiable entities at the layout level of the design. Thus the designer is unable to easily compare synthesized behavior of any particular module of the RTL or gate level netlist design with the collective behavior of cells of the layout level netlist design that would otherwise have formed that module.

U.S. patent application Ser. No. 10/117,761, entitled "IC Layout System Employing a Hierarchical Database", filed Apr. 3, 2002 and incorporated by reference herein, describes a layout tool that compiles gate level netlist 4 into a hierarchical database 13 (as depicted in FIG. 1 herein) that keeps track not only of the position of each cell within layout 6 but also of the position of each cell of the design within the modular hierarchy defined by 4 gate level netlist 4. With such information available in database 13, the designer may direct layout tool 5 to place cells forming selected modules within separate and distinct areas of the semiconductor substrate. Although such restrictions on cell placement can make it more difficult for layout tool 5 to place and route the IC design, restricting selected modules to distinct areas of the substrate provides some advantages. For example, when the design of a module placed in a distinct area of a substrate is changed, layout tool 5 may be able to subsequently modify the layout of that module only without having to modify the layout of any other portion of the IC, provided that the dimensions of the space needed to contain the revised module and the number, nature and position of the module's input and output (I/O) terminals (ports) remain unchanged.

A hierarchical database 13 that remembers how cells are organized in the modular design hierarchy also enables netlist compiler 8 to produce a layout level netlist 9 in which cells are organized into a modular hierarchy that is analogous to that of and gate level netlist 4. This would make it easier for the designer to compare simulation and verification results of the gate and layout level netlists 4 and 9 for all modules, even modules that are not placed in distinct areas of the substrate. Unfortunately, in the course of generating layout 6, layout tool 5 can alter the definition of a module in a way that makes it more difficult to compare simulator results for that module before and after placement.

As discussed above, gate level netlist 4 defines each module residing at any given level of the hierarchy as being a collection of interconnected leaf cells and/or other modules residing at a lower level of the hierarchy. A module's "ports" are the input/output terminals of the module that are connected to the nets linking the module's cells with cells of other modules. Those module ports form a part of a module's definition in RTL and gate level netlists 1 and 4. When a simulator 11 simulates the behavior of a particular module described by the RTL or gate level netlist 1 or 4, it generates data describing the behavior of signals passing in an out of the module ports via those nets. To make it easy to compare results of simulating a corresponding module described by layout level netlist 9, that layout level module should include the same set of ports as the corresponding module described by RTL and gate level netlists 1 and 4.

However, in the course of designing the nets that interconnect the cells forming the modules, layout tool 5 can alter the number and nature of ports a module may need to accommodate one or more of the nets by inserting buffers into the nets to decrease signal path delays. Even though compiler 8 may be able to compile layout 6 into a hierarchical layout level netlist 9, simulation and verification results of some of the modules described by layout level netlist 9 may not be directly comparable with simulation and verification results of corresponding modules described by the RTL and layout level netlists 1 and 4 because corresponding modules may not have the same set of ports.

FIG. 3 illustrates a hierarchy of modules A–E as might be depicted by gate level netlist 4 of FIG. 1. Module A includes a pair of gate cells 18 and 19, and modules B and C include gate cells 20 and 21, respectively. Within the design hierarchy defined by gate level netlist 4 of FIG. 1, modules B and C are submodules ("descendants") of a common "ancestor" module D, and modules A and D are in turn descendants of their common ancestor module E. The output of cell 18 drives inputs of cells 19–21 via a common net 22 entering the modules though various ports P1–P4. While gate level netlist 4 describes modules A–D as having ports P1–P4, respectively, interconnected by net 22, it does not place any restriction on the manner in which layout tool 5 might route signal paths forming net 22 between modules ports and to the gate terminals within the modules.

A designer will often want delays through selected paths between cells within the IC to remain below specified maximum path delays and will therefore impose constraints 7 (FIG. 1) on the layout directing layout tool 5 to keep those signal path delays within the specified maximums. Therefore after layout tool 5 generates layout 6, it employs a timing analysis tool to calculate the delays within the routing paths of interest based on the physical characteristics of the paths. Where path delays are excessive, layout tool 5 inserts buffers in various segments of the signal paths as necessary to reduce path delays. The capacitance of a signal path contributes to signal path delay by increasing the rise and fall time of signal edges, and when layout tool 5 places a buffer in a path segment, the buffer supplies additional charging current that reduces signal rise and fall times, thereby reducing path delay.

When layout tool 5 inserts a buffer in a signal path, it updates hierarchical database 13 to indicate that the buffer has been incorporated into the IC and assigns the buffer to a particular module of the hierarchical design. Compiler 8 thereafter adds the buffer to the indicated module when generating layout level netlist 9. Simulation and verification tools 11 may then account for the affects of the inserted buffer when simulating or verifying module behavior.

Since adding a buffer to a module of layout level netlist 9 does not alter the logic of a module, the buffer does not necessarily alter the module's definition in a way that renders simulation and verification results for that module any less comparable with simulation and verification results for a corresponding module of gate level netlist 4. However depending on how a signal path is routed within and between modules, depending on which segment of the signal path receives the buffer insertion, and depending on the module to which the inserted buffer is assigned, insertion of the buffer can force compiler 8 to alter the number of ports of one or more modules of layout level netlist 9 needed to accommodate the net. When simulating and verifying behavior of a module, the designer is usually interested in the behavior of the signal appearing at the module's ports. Thus when the layout tool 5 alters the number of ports of a module, it becomes more difficult for the designer to compare gate level and layout level simulation and verification results. Changing the number of ports of a module during the layout process also makes it impossible to alter the layout of that module only without having to also alter the layout of other modules that communicate with it through those ports.

FIG. 5 illustrates how layout tool 5 might generate a modular netlist from the layout of FIG. 4 after the layout tool has inserted a buffer 24 in the net to decrease the path delay from cell 18 to cells 20 and 21. In this example layout tool 5 has assigned buffer 24 to a portion of module E that is external to its descendant modules A and D. Here the insertion of buffer 24 into the net in module E outside of modules A or D does not affect the number of ports of any module. As illustrated in FIGS. 6 and 7, layout tool 5 could also have assigned buffer 24 to a portion of module D outside modules B and C or to module A without having affected the nature or number or ports of any module.

FIG. 8 illustrates an alternative in which layout tool 5 assigns buffer 24 to module B. This alternative forces compiler 8 to increase the number of ports of module B from one to two in layout level netlist 9 because it has to "split" port P2 into two separate ports. In such case, simulation and verification results for module B of layout level netlist 9 of FIG. 1 would not be port-by-port comparable with simulation and verification results for the corresponding module B of the RTL and gate level netlist 1 and 4 as depicted in FIG. 3.

FIGS. 4–8 demonstrate that the insertion of buffer 24 into the net linking cell 18 to cells 20 and 21 may or may not require compiler 8 to alter the number of ports for module B, depending in part on the module to which the inserted buffer 24 is assigned. With buffer 24 assigned to module A as in FIG. 7, no change is required in the number of module ports. However with the buffer assigned to module B as in FIG. 8, there is no way for compiler 8 to create a module B in layout level netlist 9 having only a single port associated with the net linking cell 18 to cells 19–21.

FIG. 9 illustrates another net layout tool 5 might create to link cell 18 to cells 19–21. FIGS. 10–13 illustrate alternative approaches layout tool 5 might take for reducing path delay from cell 18 to cells 19 and 21 without affecting the path delay to cell 20. In FIG. 10 a buffer 26 inserted into segment 27 is assigned to module A. This buffer insertion plan requires compiler 8 to unacceptably split port P1 of module A and port P4 of module D, thereby adversely affecting the module definition of both ports. FIG. 11 shows that assigning buffer 26 to module E at the same hierarchical level as modules A and D splits ports P1 and P4. Assigning buffer 26 to module A would also split ports P1 and P4.

FIG. 12 illustrates a buffer insertion plan in which layout tool 5 inserts separate buffers 28 and 30 into segments 29 and 31 of the network of FIG. 9. This approach reduces signal path delays from cell 18 to cell 19 and 21 but does not split any module ports. Although port P1 appears to be split in FIG. 12, compiler 8 would not treat the two occurrences of port P1 as separate ports because segment 27 ties them together so the two P1 ports convey the same signal. The same is true with respect to port P4.

FIGS. 9–11 demonstrate that in some cases inserting a buffer into one segment of a net will change the number of ports of one or more modules regardless of the module to which the buffer is assigned. FIGS. 9–12 also show that it is possible to insert buffer into some, but not all, segments of a net without splitting module ports.

A buffer insertion can also cause a reduction in the number of module ports. For example assume that, as illustrated in FIG. 13, gate level netlist 4 of FIG. 1 defines module A as having two ports P1A and P1B as illustrated in FIG. 13, and that ports P1A and P1B are tied together in module E, outside of module A. When layout tool 5 inserts a buffer 32 as illustrated in FIG. 14 to decrease the path delay between cells 18 and 19, with buffer 32 being assigned to module E, then there is no change to the number of module A ports. However if layout tool assigns buffer 32 to module A as illustrated in FIG. 15, then compiler 8 of FIG. 1 would have show port P1B as being disconnected from the net. Simulation and verification results for module A of the layout level netlist 9 (FIG. 1) would therefore no longer be directly comparable to the results of a corresponding module A of RTL and gate level netlists 1 and 4 on a port-by-port basis.

The foregoing examples demonstrate that for compiler 8 of FIG. 1 to produce a hierarchical layout level netlist 9 in which each module has the same set of ports as a corresponding module of gate level netlist 4, it is necessary for layout tool 5 to avoid inserting buffers in a way that spits module ports or disconnects them from the net. What is needed is a system for enabling a layout tool to determine when a proposed buffer insertion will split or disconnect a module port so that the layout tool will know to choose an alternative buffer insertion approach when adjusting path delays in any net.

BRIEF SUMMARY OF THE INVENTION

An integrated circuit (IC) layout system determines positions within a semiconductor substrate of each cell forming modules of a hierarchical IC design. The layout system also designs nets for interconnecting the cells. Each module is defined as having one or more ports through which the nets extend when linking cells forming different modules. The layout system automatically inserts buffers into selected segments of the nets to reduce signal path delays through the nets and assigns the inserted buffers to selected modules.

However in accordance with the invention, the layout system inserts buffers only into those net segments for which a buffer insertion would not alter the number of ports any module needs to accommodate the net.

To determine whether insertion of a buffer into a net segment would cause a change in the number of ports of any module, the layout system first determines the lowest level modules containing ports interconnected to the net downstream of the buffer and then assigns the buffer to a lowest common ancestor module of those lowest level modules.

The layout system then inserts the buffer into the segment only when the buffer insertion does not split a module port. A split module port is detected when the port is found to be connected to the net both upstream and downstream of the buffer.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

This specification describes one or more exemplary embodiments and/or applications of the invention considered by the applicant(s) to be the best modes of practicing the invention. It is not intended, however, that the invention be limited to the exemplary embodiment(s) described below or to the particular manner in which the exemplary embodiments operate.

Figure 1:
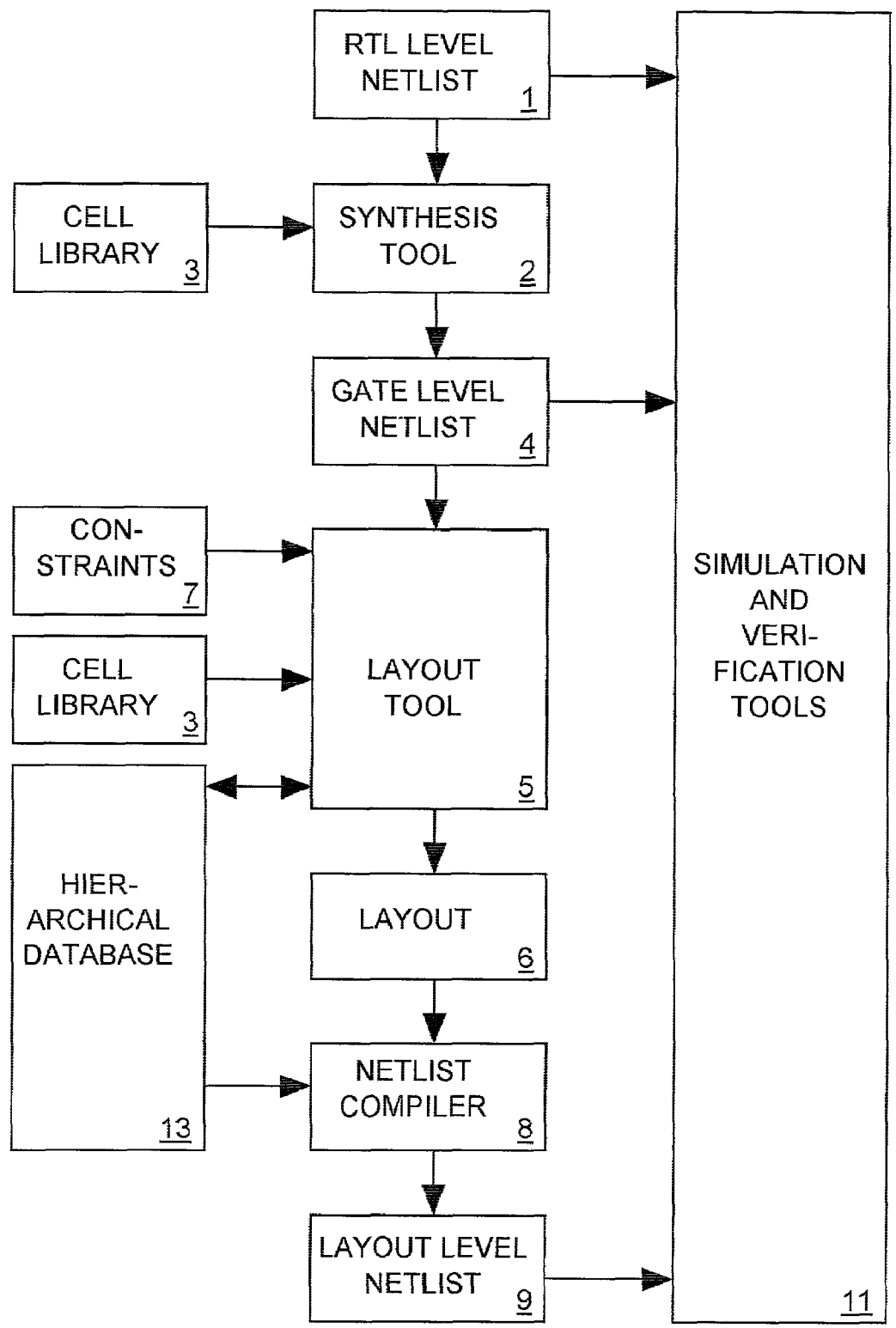
FIG. 1 is a data flow diagram illustrating a prior art integrated circuit design process.
Figure 16:
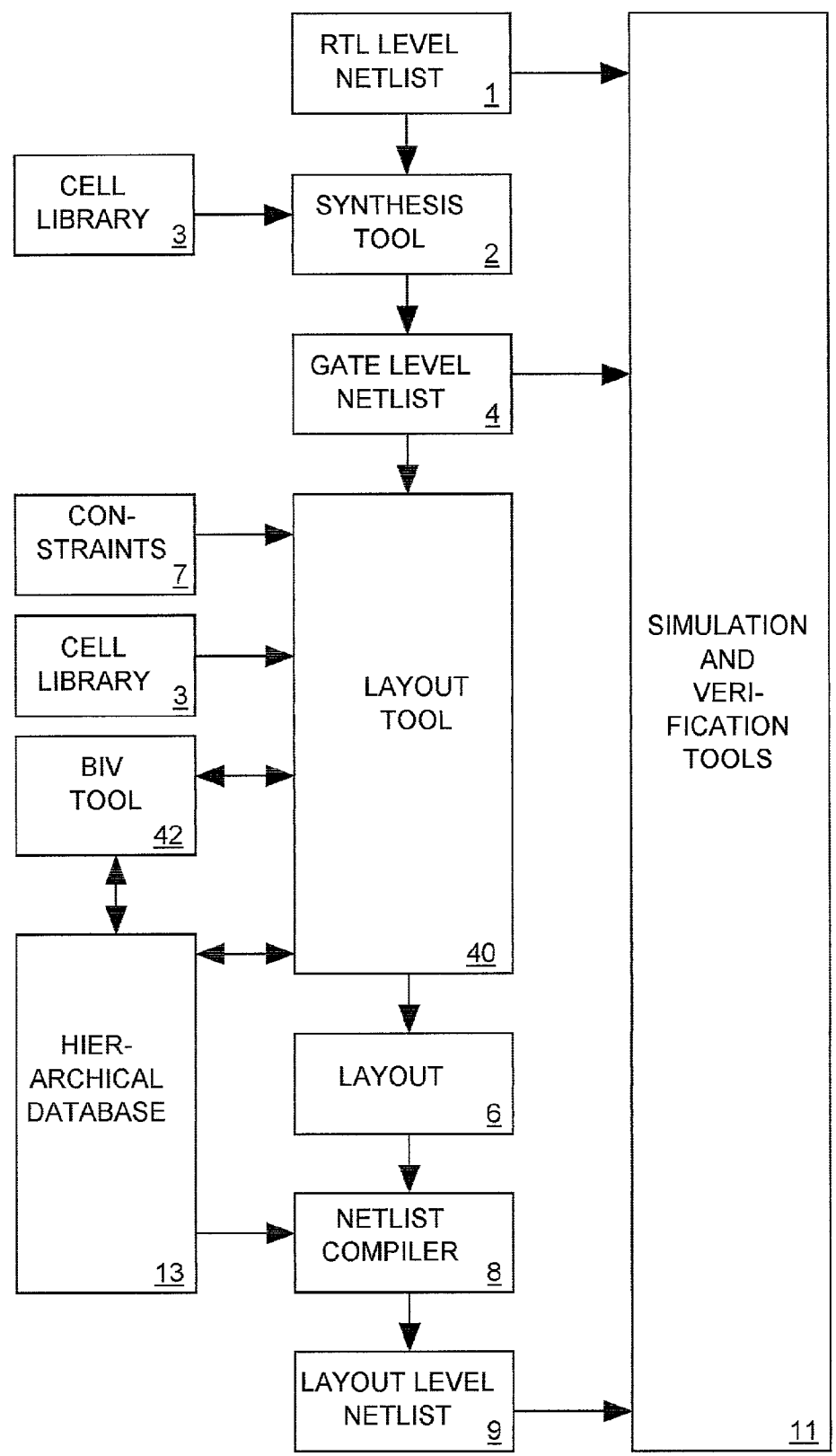
FIG. 16 is a data flow diagram illustrating an integrated circuit design process employing a buffer insertion verification (BIV) tool in accordance with the invention.

FIG. 16 is a data flow diagram depicting an integrated circuit design process in accordance with the invention that can be viewed as an improvement over the prior art design process of FIG. 1. Similar elements are therefor identified by similar reference characters. Referring to FIG. 16, an IC designer initially generates a register transfer language (RTL) netlist 1 describing an IC as a set of circuit nodes ("nets") coupled through abstractly described blocks of logic. Thereafter, using synthesis tool 2, the designer converts RTL level netlist 1 into a gate level netlist 4 describing the logic blocks in terms of the circuitry needed to implement the logic.

Figure 2:
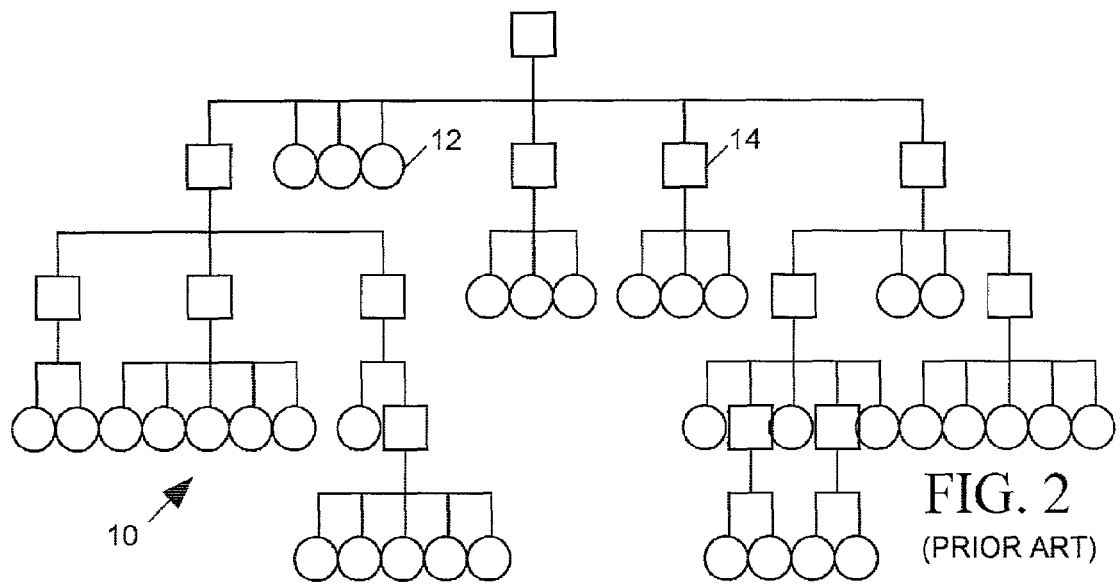
FIG. 2 is a chart illustrating a prior art IC design in which cells are organized into a hierarchy of modules.
Figure 3:
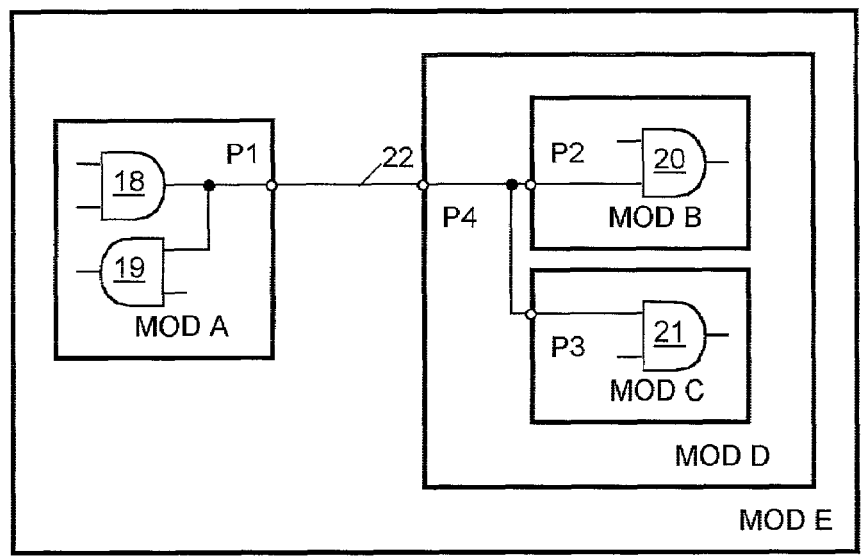
FIG. 3 is block diagram illustrating a portion of an example prior art modular IC design in which cells forming modules are interconnected through a net.
Figure 4:
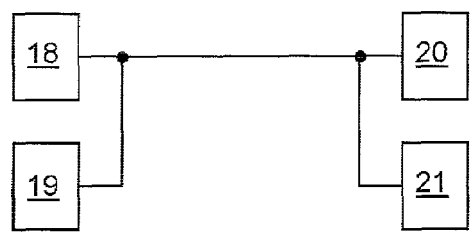
FIG. 4 is a simplified plan view of a non-hierarchical layout the prior placement and routing tool of FIG. 1 might generate based on the design of FIG. 3.
Figure 5:
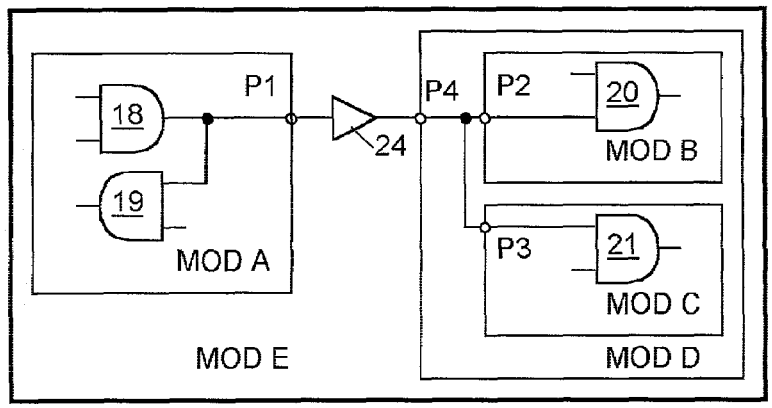
FIGS. 5–8 are block diagrams depicting effects on the design of FIG. 3 resulting from various alternative approaches the placement and routing tool of FIG. 1 might employ when inserting a buffer into the net of FIG. 4.

As exemplified in FIG. 2, gate level netlist 4 organizes the IC design 10 into a hierarchy of interconnected leaf cells 12 and modules 14. After creating gate level netlist 4, the designer uses a layout tool 40 to generate a layout 6 for the IC design described by gate level netlist 4. U.S. patent application Ser. No. 10/117,761, filed Apr. 3, 2002 (incorporated herein by reference) describes a layout system implementing many of the features of layout tool 40. Consulting cell library 3 to determine the size, shape and internal layout of each leaf cell 12 layout tool 40 finds a suitable position for each leaf cell within a semiconductor substrate and determine how to route signal paths interconnecting cell terminals in the manner described by the netlist. In developing layout 7, layout tool 40 tries to satisfy various constraints 7 the designer places on cell placement and path routing.

Layout tool 40 maintains a hierarchical database 13 referencing each cell of layout 6 and indicating its position within the design hierarchy. When told to do so by constraints 7, layout tool 40 may place some of the modules of the design in separately identifiable areas of the substrate. However cells forming all other modules of the design may be placed irrespective of their position in the modular hierarchical and may be intermingled in the substrate. Consulting database 13 to determine the module to which each cell of layout 6 is assigned. A netlist compiler 8 converts layout 6 into a hierarchical layout level netlist 9, consulting database 13 to determine the module to which each cell is assigned. During the design process, the designer may employ simulation and verification tools 11 to check IC design specified by RTL, gate and layout level netlists 1, 4 and 9 to determine whether the modules they describe will behave as expected. For example the designer may employ a circuit simulator to produce waveform data inditing how signal produces at the input/output terminals (ports) of modules change with time when the IC is stimulated with a defined set of input signals.

As it generates layout 6, layout tool 40 may insert buffers into various segments of nets it creates for routing signals between terminals of the cells forming the ICs. The buffers reduce signal path delays to keep them within maximum limits specified by constraints 7. The buffers may be either inverting or non-inverting buffers, but when inverting buffers are employed, they are inserted in multiples of two within any signal path between transmitting and receiving cells to avoid altering signal states at the receiving cell. When layout tool 40 inserts a buffer into a segment of any net within layout 6, it assigns the buffer to one of the modules and then updates database 13 to include a reference to the buffer. Thereafter netlist compiler 8 includes the inserted buffer in that module of the layout level netlist 9.

Synthesis tool 2, netlist compiler 8 and simulation and verification tools 11, layout tool 40 and netlist compiler 8 are suitably implemented by storing software programs on computer-readable media which are then supplied as program inputs to one or more conventional, general purpose computers, thereby causing the computer(s) to carry out the functions of these tools. Well-known computer-readable media suitable for storing the software include but are not limited to, compact disks, floppy disks, hard disks, and random access or read only memory. Cell library 3 is suitably implemented as a database included in the computer-readable media accessed by the computer(s). RTL level netlist 1 and constraints 7 may be supplied to the computer(s) implementing Synthesis tool 2, simulation and verification tools 11 and layout tool 40 in the form of data contained on the computer-readable media or through any appropriate user interface. The computer(s) implementing synthesis tool 2, layout tool 40 and netlist compiler 8 create and maintain data files in computer-readable media, the data files implementing gate level netlist 4, hierarchical database 13, layout 8, layout level netlist 9.

The invention relates in particular to a "buffer insertion verification" (BIV) tool 42 that layout tool 40 consults before inserting a buffer into any signal path. BIV tool 42 is suitably implemented in the form of software stored on computer-readable media which causes a computer (preferably the computer that also implements layout tool 40) to carry out the function of BIV tool 42. BIV tool 42 may be incorporated into software implementing layout tool 5 as a subroutine or procedure thereof.

As discussed above, when a layout tool inserts a buffer into a signal path, it is possible that netlist compiler 8 may have to alter the number an nature of ports of one or more modules when generating layout level netlist 9. In such case a lack of correspondence between number and nature of module ports would render results of simulation and verification of a module of the layout level netlist 9 less directly comparable with results of simulation and verification of a corresponding module of gate level net list 4. Therefore when layout tool 40 wants to insert a buffer into some segment of a net within layout 6, it requests BIV tool 42 to approve the proposed buffer insertion.

BIV tool 42 first selects a module to which the buffer can be assigned so as to render the buffer insertion least likely to alter the number of module ports connected to the network. BIV tool 42 then determines whether insertion of the buffer assigned to the selected module in the net segment selected by layout tool 5 will cause a change in the number of ports of any module. If the buffer insertion has no effect on the number of ports of any module of the IC, BIV tool 42 replies to the buffer insertion request by telling layout tool 40 that the proposed buffer insertion is acceptable and indicating the module to which the buffer is to be assigned. Layout tool 40 then updates database 13 to indicate that the buffer has been inserted into the desired net segment and that the buffer has been assigned to the module chosen by BIV tool 42. Otherwise when BIV tool 42 determines that the buffer insertion will change the number of ports, its reports back to layout tool 40 that the proposed buffer insertion is unacceptable, so that layout tool 40 develop another buffer insertion plan.

Figure 17:
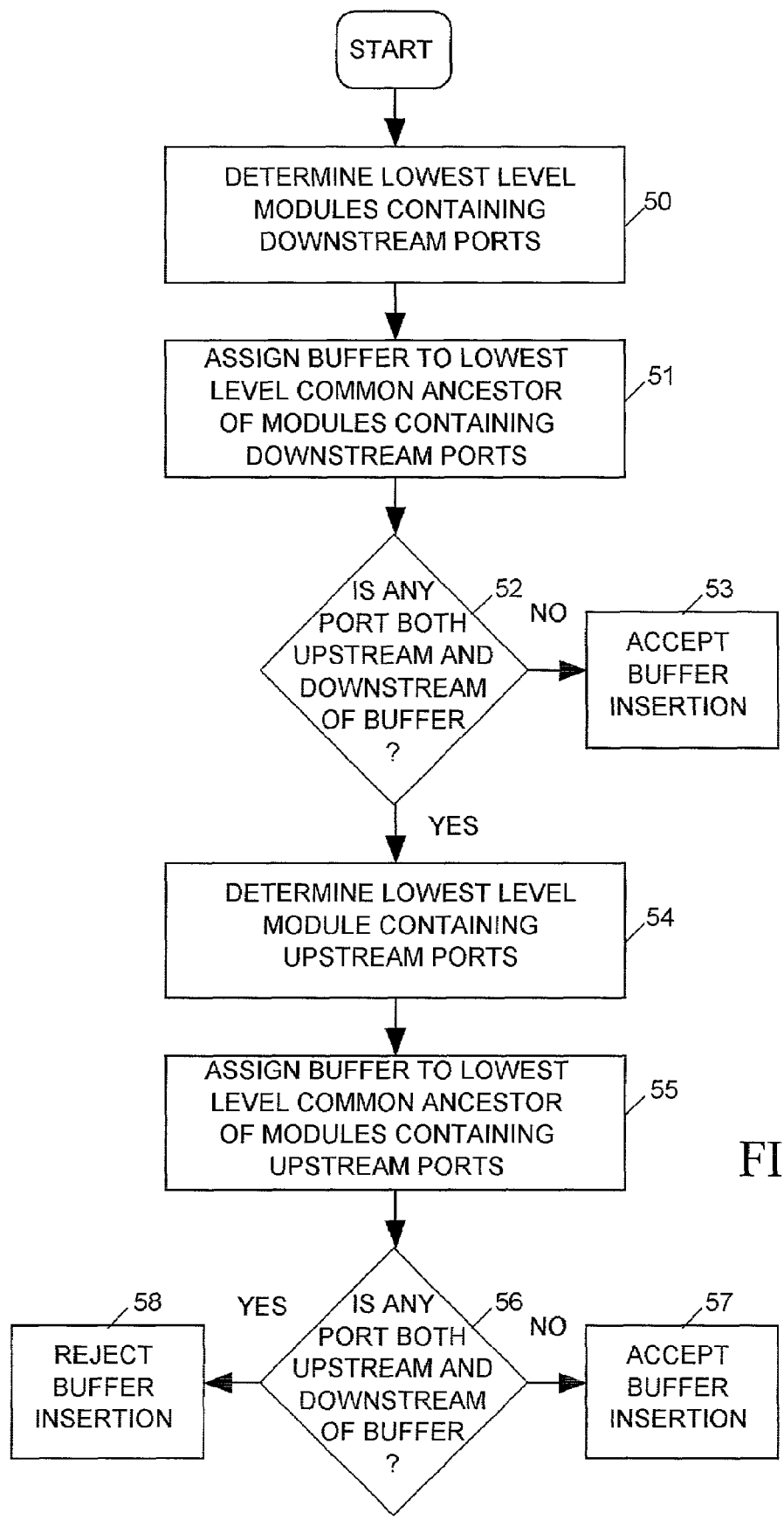
FIG. 17 is a flow chart illustrating operation of the BIV tool of FIG. 16.

FIG. 17 is a flow chart illustrating how BIV tool 42 responds to a buffer insertion request from layout tool 40. BIV tool 42 initially (step 50) determines the lowest level modules containing ports that are downstream of the "target" segment of the net that is to receive the buffer. In the example of FIGS. 4–8, when reviewing the proposed insertion of buffer 24 into the target segment, BIV tool 42 finds that only ports P2 and P3 are downstream of the buffer and that those ports reside in modules B and C.

Figure 6:
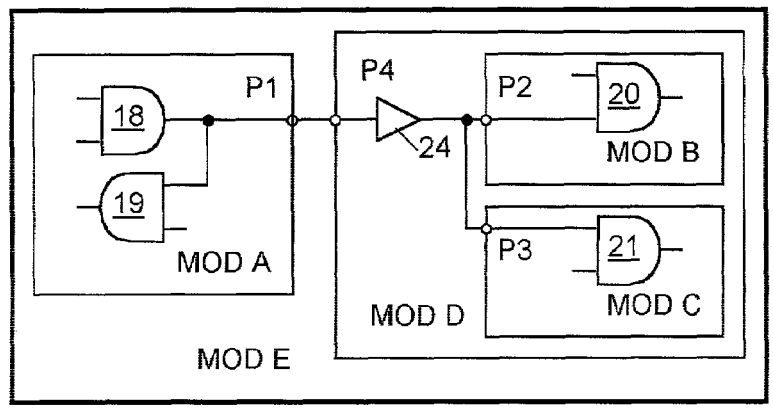
Figure 7:
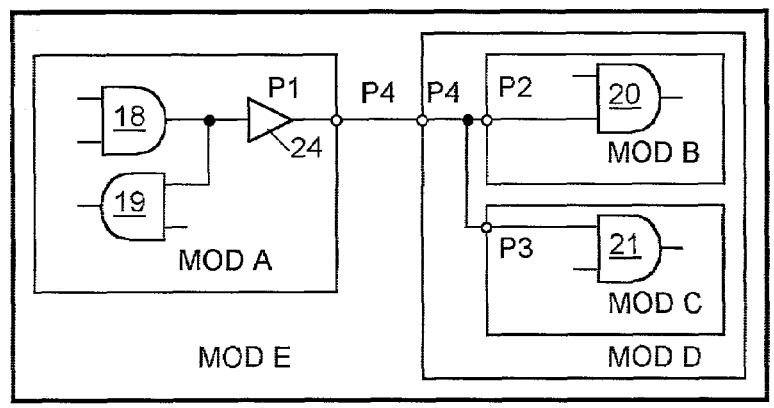
Figure 8:
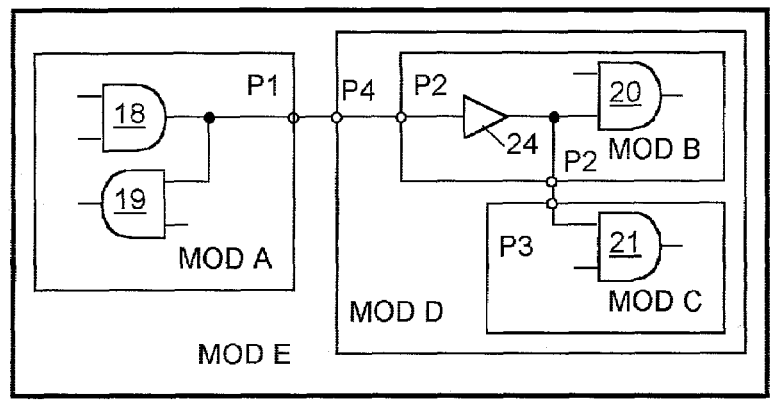

BIV tool 42 then (step 51) assigns the buffer to the lowest level common ancestor module (D) of the modules (B and C) containing the downstream ports, as illustrated in FIG. 6. BIV tool 42 next determines whether insertion of the buffer will cause an increase in the number of ports of any module by splitting a port. To do so, BIV tool 42 (step 52) determines whether the same port appears both upstream and downstream of buffer, as this indicates that the buffer insertion has split a module port. If the same port does not appear both upstream and downstream of the buffer, BIV tool 42 responds to the request by accepting the buffer insertion (step 52). Layout tool 40 then appropriately updates database 13 to incorporate the buffer into the IC design.

For example, having assigned buffer 24 to module D as illustrated in FIG. 6 (step 52), BIV tool 42 finds only port P1 upstream of buffer 24 and finds only ports P2, P3 and P4 downstream of the buffer. Since the same port does not appear both upstream and downstream of buffer 24 (step 54), BIV tool 42 reports back to layout tool 40 that the proposed insertion of buffer 24 is acceptable (step 53). Note that by assigning buffer 24 to the lowest level common ancestor module D of the modules B and C containing downstream ports, BIV tool 42 avoids the possibility of splitting a port by assigning buffer 24 too low in the modular hierarchy as illustrated, for example, in FIG. 8.

Figure 9:
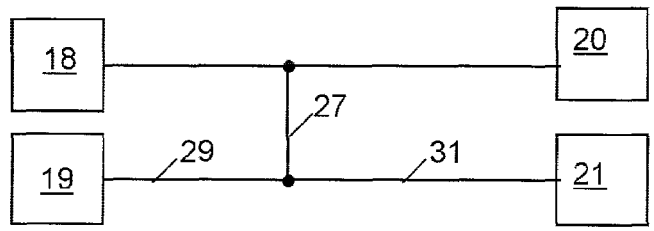
FIG. 9 is a simplified plan view of another non-hierarchical layout the prior placement and routing tool of FIG. 1 might generate based on the design of FIG. 3.
Figure 10:
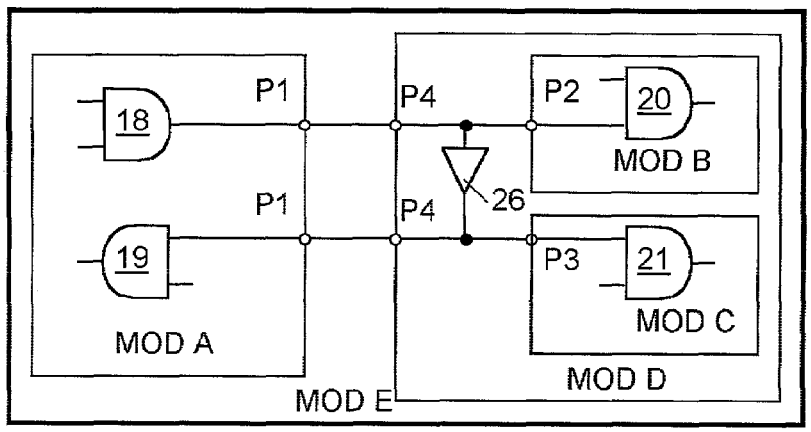
FIGS. 10–12 are block diagrams depicting effects on the design of FIG. 9 resulting for various alternative approaches the placement and routing tool of FIG. 1 might employ when inserting a buffer into the net of FIG. 9.
Figure 11:
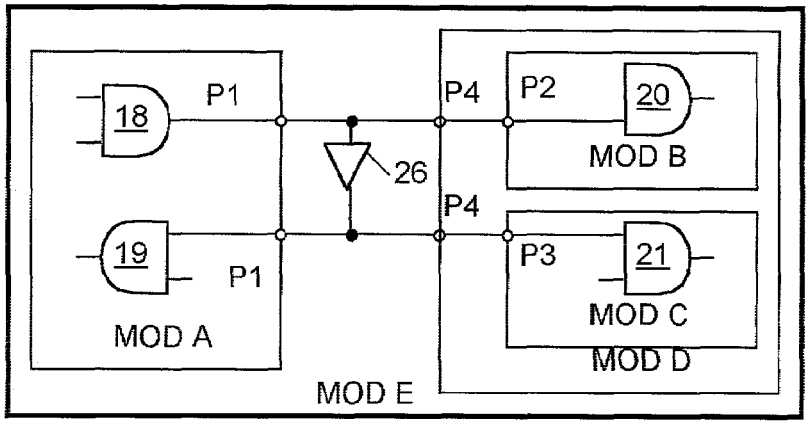
Figure 12:
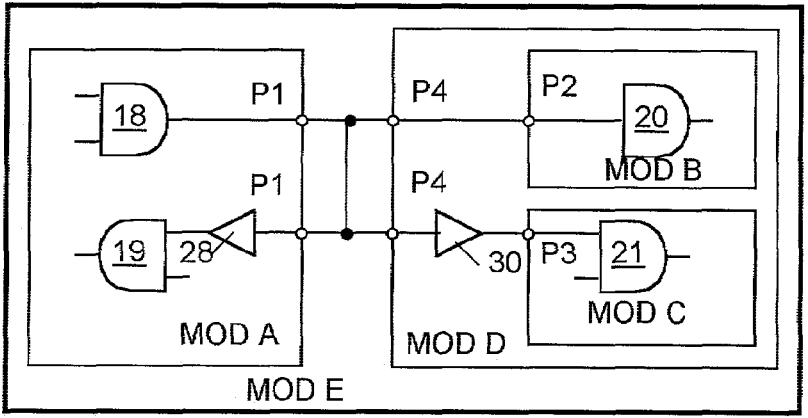

In the example of FIGS. 9–11, when layout tool 40 proposes inserting a buffer 26 into net segment 27, BIV tool 42 first checks database 13 to determine the lowest level modules containing the ports downstream of buffer 26 (step 50) and finds downstream ports P1 and P3 reside in modules A and C, respectively. BIV tool 42 next (step 51) determines from database 13 that module E is the lowest level common ancestor module of the modules A and C containing downstream ports P1 and P3 and therefore assigns buffer 26 to module E as illustrated in FIG. 11. However, at step 52, looking downstream of buffer 26, BIV tool 42 finds ports P1, P4 and P3, and looking upstream of buffer 26, BIV tool 42 finds ports P1, P2 and P4. Since it finds ports P1 and P4 both upstream and downstream of buffer 26, BIV tool 42 determines that assigning buffer 26 to module E has split those ports and therefore does not accept the assignment of buffer 26 to module E. It instead tries to reassign the buffer to another level module.

To do so, BIV tool 42 first determines the lowest level modules containing ports upstream of the buffer to be inserted (step 54). In this case BIV tool 42 sees modules A, B and D contain ports P1, P2 and P4 upstream of buffer 26. It therefore re-assigns buffer 26 to the lowest level common ancestor (module E) of all modules containing upstream ports (step 55). It then determines whether the same port appears both upstream and downstream of the re-assigned buffer (step 56). If not, BIV tool 42 accepts the buffer insertion (step 57). However in the example case, with buffer 26 assigned (again) to module E, ports P1 and P4 appear both upstream and downstream of buffer 26. BIV tool 42 therefore responds to the buffer insertion request by indicating that the proposed buffer insertion is unacceptable (step 58). Layout tool 40 may then try inserting one or more buffers into other segments of the net, or may try re-designing the net.

Figure 13:
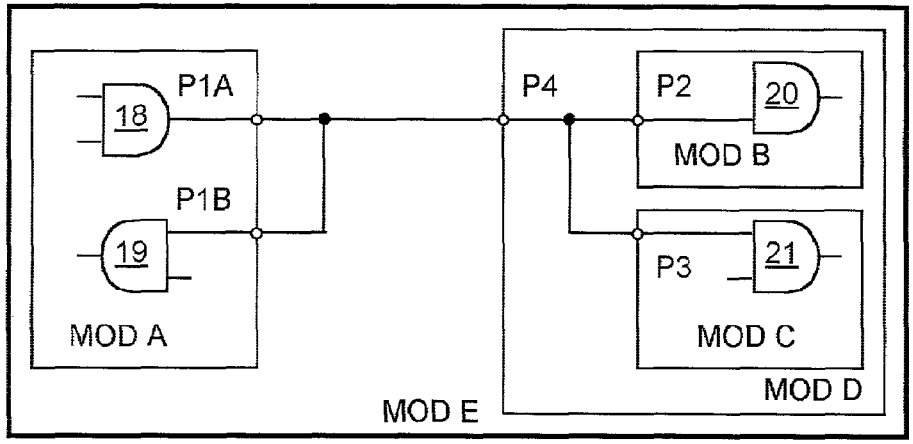
FIG. 13 is block diagram illustrating a portion of another example prior art modular IC design in which cells forming modules are interconnected through a net.
Figure 14:
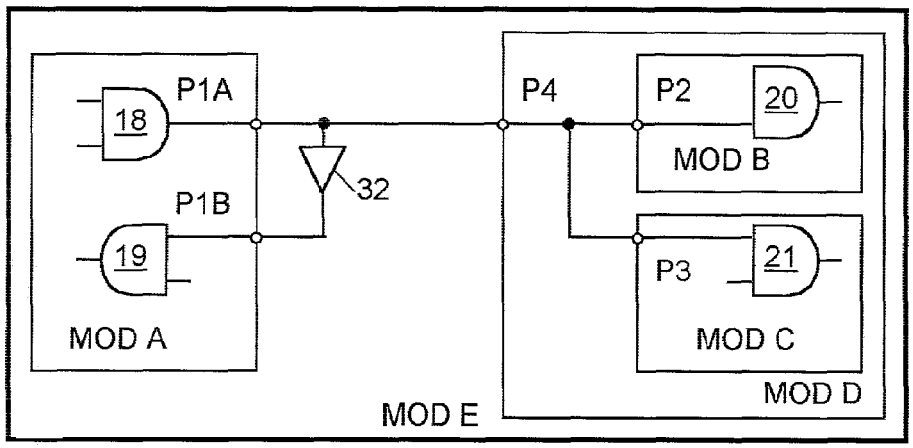
FIGS. 14 and 15 are block diagrams depicting various alternative approaches the placement and routing tool of FIG. 1 might employ when inserting a buffer into the net of FIG. 13.
Figure 15:
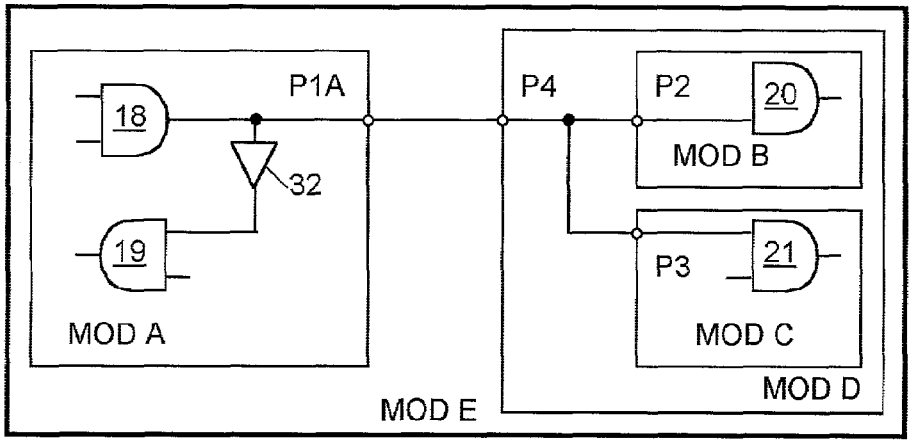

In the example of FIGS. 13–15, when layout tool 40 proposes inserting buffer 32 into the net between ports P1A and P1B, BIV tool 42 finds only port P1B residing downstream of buffer 32 (step 50) and therefore, as illustrated in FIG. 14, assigns buffer 32 to module E, the lowest level common ancestor of the lowest level module A containing port P1B (step 52). Finding no single port appearing both upstream and downstream of buffer 32 (step 54), BIV tool 42 notifies layout tool 40 that the proposed buffer insertion is acceptable (step 58). Note that by assigning buffer 26 to the lowest level ancestor module E of module A rather than to module A itself, as illustrated in FIG. 15, BIV tool 42 avoids the possibility of the buffer insertion disconnecting port P1B from the net, thereby preserving the number of active module A ports.

Figure 18:
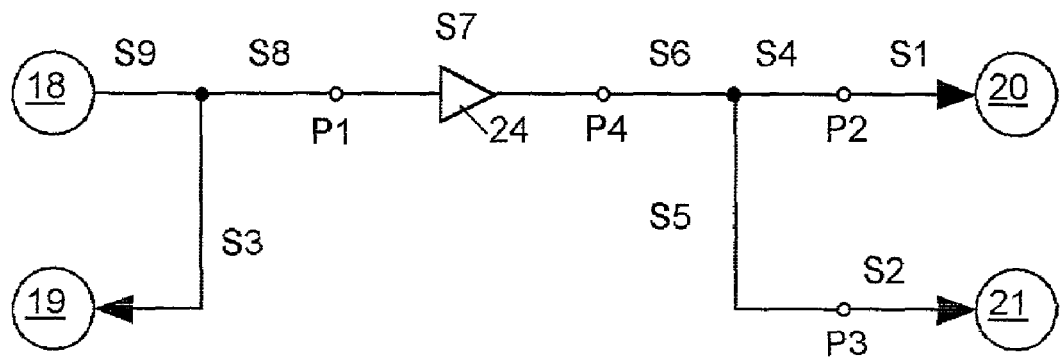
FIG. 18 is a diagram showing relative positions of ports and segments of the net depicted by FIG. 3 relative to an inserted buffer.

FIG. 18 illustrates a method for carrying out step 52 or 56 of FIG. 17, in which BIV tool 42 determines whether any port appears both upstream and downstream of the buffer. FIG. 18 depicts the net of FIG. 4 in which layout tool 40 has proposed inserting a buffer in a net segment S7 extending between ports P1 and P4. In order to determine whether any port appears both upstream and downstream of buffer 24, BIV tool 42 first builds the following Table I representing the net as a tree having an entry for each segment of the net, with the "segments" of the net being separated by ports and branch nodes:

TABLE 1

| SEG | PORT COUNT |
| --- | --- |
| S1 | NULL |
| S2 | NULL |
| S3 | NULL |
| S4 | [P2,1] |
| S5 | [P3,1] |
| S6 | [P2,1] + [P3,1] |
| S7 | [P2,1] + [P3,1] + [P4,1] |
| S8 | [P1,1] + [P2,1] + [P3,1] + [P4,1] |
| S9 | [P1,1] + [P2,1] + [P3,1] + [P4,1] |

BIV tool 42 builds Table I starting with entries associated with the "leaf" segments S1–S3 directly connected to the signal receiving leaf cells 19–21 at the downstream ends of the net and working upstream toward the entry for the "root" segment S9 connected to the cell 18 that drives the net. Each entry in Table I contains "port count" data pairs referencing the number of occurrences, if any, of each port appearing downstream of the segment. The port count data for the entries associated with segments S1–S3 are empty (NULL) because BIV tool 42 does not encounter any ports downstream of segments S1–S3. The port count entry for segment S4 contains a single data pair [P2,1] referencing port P2 because port P2 is the only port downstream of segment S4. The first field of the data pair references port P2, and the second field of the data pair indicates the number (1) of occurrences of port P2 downstream of the segment. BIV tool 42 builds the entry for segment S4 adding to the entry for segment S1 a data pair representing the count for the port P2 traversed when moving down the tree from segment S1 to segment S4.

Similarly port count entry for segment S5 contains a single data pair [P3,1] indicating one occurrence of port P3 because port P3 is the only port downstream of segment S5. BIV tool 42 builds the entry for segment S5 incrementing the entry for segment S2 to include the count for the port P3 traversed when moving down the tree from segment S2 to segment S5.

BIV tool 42 next builds the entry for segment S6, by combining the entries for segments S4 and S5. BIV tool 42 then builds the entry for segment S7 by adding an occurrence of traversed port P4 to the entry for segment S6 and thereafter builds the entry for segment S8 by adding an occurrence of traverse port P1 to the entry for segment S7.

Finally, the entry for root segment S9 is generated by summing the entries for segments S3 and S8.

At this point the table entry for segment S7 indicates the number of occurrences of each port downstream of buffer 24.

Downstream ports=[P2, 1]+[P3,1]+[P4,1]

To determine the number of occurrences of each port upstream of buffer 24, BIV tool 42 subtracts the entry for segment S7 from the entry for root segment S9 as follows:

$$\text{Upstream ports} = [P1, 1] + [P2, 1] + [P3, 1] + [P4, 1] -$$
$$[P2, 1] - [P3, 1] - [P4, 1]$$
$$= [P1, 1]$$

Since ports P2, P3 and P4 appear downstream of the buffer, only port P1 appears upstream of the buffer, BIV 42 can easily determine that the same port does not appear both upstream and downstream of the buffer. BIV tool 42 thus reports the proposed buffer insertion to be acceptable.

Figure 19:
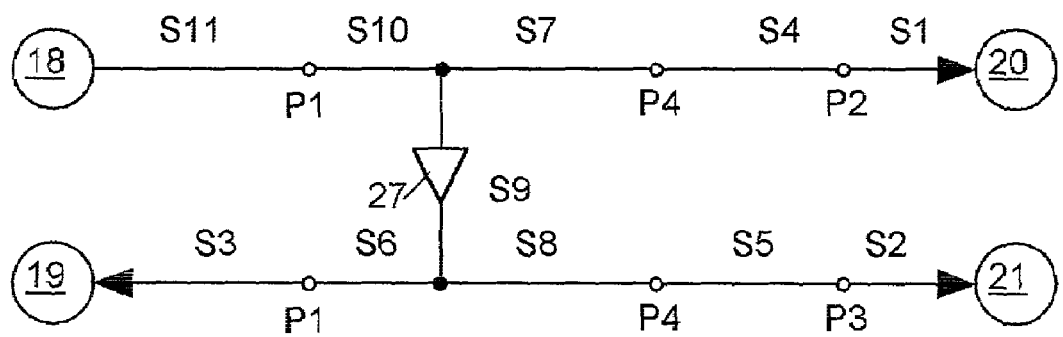
FIG. 19 is a diagram showing relative positions of ports and segments of the net depicted by FIG. 9, relative to an inserted buffer.

FIG. 19 illustrates the tree BIV 42 traverses for the net illustrated in FIG. 9 where layout tool 40 has proposed inserting a buffer 26 in segment 27 (segment S9 of FIG. 19). BIV tool 42, having assigned buffer 26 to module E as illustrated in FIG. 10, builds the following Table II for that buffer insertion proposal:

TABLE II

| SEG | PORT COUNT |
|-----|------------|
| S1  | NULL |
| S2  | NULL |
| S3  | NULL |
| S4  | [P2,1] |
| S   | [P3,1] |
| S6  | [P1,1] |
| S7  | [P2,1] + [P4,1] |
| S8  | [P3,1] + [P4,1] |
| S9  | [P1,1] + [P3,1] + [P4,1] |
| S10 | [P1,1] + [P2,1] + [P3,1] + [P4,2] |
| S11 | [P1,2] + [P2,1] + [P3,1] + [P4,2] |

The entry for segment S9 references the ports downstream of buffer 27:

Downstream ports=[P1,1]+[P3,1]+[P4,1]

Since entry for root segment S11 references all ports of the net, BIV tool 42 computes the number of ports upstream of buffer 27 by subtracting the port count for segment S9 from the port count for segment S11

$$\text{Upstream ports} = [P1, 2] + [P2, 1] + [P3, 1] + [P4, 2] -$$
$$[P1, 1] - [P3, 1] - [P4, 1])$$
$$= [P1, 1] + [P2, 1] + [P4, 1]$$

Comparing the downstream and upstream ports, BIV tool 42 finds that ports P1 and P2 appear both downstream and upstream of buffer 27, and therefore rejects the proposed buffer insertion.

While those of skill in the art will appreciate that in other embodiments of the invention BIV tool 42 may employ other approaches to determining whether a proposed buffer insertion will alter a number of module ports, the table-building approach described above is preferred as being computationally efficient.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. For a system for generating a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the system alters the IC design when generating the layout by inserting buffers into selected segments of the nets, a method for execution by the system for determining whether to insert a buffer into a particular segment of a net, the method comprising the steps of:

a. assigning the buffer to a selected module of the hierarchy of modules for insert within the selected module, and b. determining whether insertion of the buffer assigned to the selected module into the particular segment of the net will alter a number of ports of any one of the modules through which the net passes.

2. The method in accordance with claim 1 further comprising the step of:

c. refraining from inserting the buffer into the particular segment when it is determined at step b that insertion of the buffer will alter the number of ports of any one of the modules required to accommodate the net.

3. The method in accordance with claim 2 further comprising the step of:

d. inserting the buffer into the particular segment when it is determined at step a b that the insertion of the buffer will not alter the number of ports of any one of the modules required to accommodate the net.

4. The method in accordance with claim 1 wherein step b comprises the substep of determining whether any port is connected to the net both upstream and downstream of the particular segment.

5. The method in accordance with claim 1 wherein step a comprises the substeps of:

a1. ascertaining for each port downstream of the particular segment, a module of the hierarchy containing the port, and a2. assigning the buffer to a lowest level common ancestor module of all modules ascertained at step a1.

6. The method in accordance with claim 5 wherein step b comprises the substep of determining whether any port is connected to the net both upstream and downstream of the particular segment.

7. The method in accordance with claim 6 further comprising the step of:

c. refraining from inserting the buffer into the particular segment when it is determined at step b that the insertion of the buffer will alter a number of ports of any one of the modules required to accommodate the net.

8. The method in accordance with claim 7 further comprising the step of:
   d. inserting the buffer into the particular segment when it is determined at step a that the insertion of the buffer will not alter a number of ports of any one of the modules required to accommodate the net.

9. For a system for generating a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the system alters the IC design when generating the layout by inserting buffers into selected segments of the nets, a method for execution by the system for determining whether to insert a buffer into a particular segment of a net, the method comprising the steps of:
   a. assigning the buffer to a selected module of the hierarchy of modules, and
   b. determining whether insertion of the buffer assigned to the selected module into the particular segment of the net will alter a number of ports of any one of the modules through which the net passes;
   wherein step a comprises the substeps of:
      a1. ascertaining for each port downstream of the particular segment, a module of the hierarchy containing the port, and
      a2. assigning the buffer to a lowest level common ancestor module of all modules ascertained at step a1;
   wherein step b comprises the substep of determining whether any port is connected to the net both upstream and downstream of the particular segment, comprising the further substeps of:
      b1. counting a first number of times each port is connected to the net,
      b2. counting a second number of times each port is connected to the net downstream of the selected segment,
      b3. determining a third number of times each port is connected to the net upstream of the selected segment by subtracting the second number from the first number for each port, and
      b4. determining whether any port is connected to the net both upstream and downstream of the particular segment when both the first and third numbers for any port are non-zero.

10. For computer programmed to generate a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the computer alters the IC design when generating the layout to indicate buffers are to be inserted into selected segments of the nets, computer-readable media storing software which when read and executed by the computer, causes the computer to carry out a method for determining whether to insert a buffer into a particular segment of a net, the method comprising the steps of:
   a. assigning the buffer to a selected module of the hierarchy of modules for insert within the selected module, and
   b. determining whether insertion of the buffer assigned to the selected module into the particular segment of the net will alter a number of ports of any one of the modules through which the net passes.

11. The computer-readable media in accordance with claim 10 wherein the method further comprises the step of:
   c. refraining from inserting the buffer into the particular segment when it is determined at step b that the insertion of the buffer will alter the number of ports of any one of the modules required to accommodate the net.

12. The computer-readable media in accordance with claim 11 wherein the method further comprises the step of:
   d. inserting the buffer into the particular segment when it is determined at step b that the insertion of the buffer will not alter the number of ports of any one of the modules required to accommodate the net.

13. The computer-readable media in accordance with claim 10 wherein step b comprises the substep of determining whether any port is connected to the net both upstream and downstream of the particular segment.

14. The computer-readable media in accordance with claim 10 wherein step a comprises the substeps of:
   a1. ascertaining for each port downstream of the particular segment, a lowest level module of the hierarchy containing the port, and
   a2. assigning the buffer to a lowest level common ancestor module of all modules ascertained at step a1.

15. The computer-readable media in accordance with claim 14 wherein step b comprises the substep of determining whether any port is connected to the net both upstream and downstream of the particular segment.

16. The computer-readable media in accordance with claim 15 wherein the method further comprises the step of:
   c. refraining from inserting the buffer into the particular segment when it is determined at step b that the insertion of the buffer will alter the number of ports of any one of the modules required to accommodate the net.

17. The computer-readable media in accordance with claim 16 wherein the method further comprises the step of:
   d. inserting the buffer into the particular segment when it is determined at step b that the insertion of the buffer will not alter the number of ports of any one of the modules required to accommodate the net.

18. The method in accordance with claim 9 wherein the steps a and b and the respective substeps thereof are implemented in software stored on computer-readable media to be read and executed by the system.

19. For a system for generating a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the system alters the IC design when generating the layout by inserting buffers into selected segments of the nets, a method for execution by the system for determining whether to insert a buffer into a particular segment of a net, the method comprising the steps of:
  a. determining whether the buffer insertion into the net will alter a number of ports of any one of the modules through which the net passes,
  b. refraining from inserting the buffer into the particular segment when it is determined at step a that the insertion of the buffer will alter the number of ports of any one of the modules required to accommodate the net, and
  c. inserting the buffer into the particular segment within a selected module when it is determined at step a that the insertion of the buffer will not alter the number of ports of any one of the modules required to accommodate the net.

20. The method in accordance with claim 19 wherein step a comprises the substep of determining whether any port is connected to the net both upstream and downstream of the particular segment.

21. For a system for generating a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the system alters the IC design when generating the layout by inserting buffers into selected segments of the nets, a method for execution by the system for determining whether to insert a buffer into a particular segment of a net, the method comprising the steps of:
  a. determining whether the buffer insertion into the net will alter a number of ports of any one of the modules through which the net passes,
  b. refraining from inserting the buffer into the particular segment when it is determined at step a that the insertion of the buffer will alter the number of ports of any one of the modules required to accommodate the net, and
  c. inserting the buffer into the particular segment when it is determined at step a that the insertion of the buffer will not alter the number of ports of any one of the modules required to accommodate the net;
  wherein step a comprises the substeps of:
    a1. counting a first number of times each port is connected to the net,
    a2. counting a second number of times each port is connected to the net downstream of the selected segment,
    a3. determining a third number of times each port is connected to the net upstream of the selected segment by subtracting the second number from the first number for each port, and
    a4. determining whether any port is connected to the net both upstream and downstream of the particular segment when both the first and third numbers for any port are non-zero.

22. Computer-readable media storing software for execution by a computer programmed to generate a layout for an integrated circuit (IC) design describing an IC as being formed by a plurality of cells organized into a hierarchy of modules in which descendant modules at lower levels of the hierarchy form ancestor modules at higher levels of the hierarchy, wherein terminals of cells forming the modules are to be interconnected in the layout by nets having segments, wherein the design defines modules as having ports through which the nets pass when extending between cells forming separate modules, wherein the computer alters the IC design when generating the layout to indicate buffers are to be inserted into selected segments of the nets, wherein when read and executed by the computer, causes the computer to determine whether to insert a buffer into a particular segment of a net by executing a method comprising the steps of:
  a. determining whether the buffer insertion into the net will alter a number of ports of any one of the modules through which the net passes,
  b. refraining from inserting the buffer into the particular segment when it is determined at step a that the insertion of the buffer will alter the number of ports of any one of the modules required to accommodate the net, and
  c. inserting the buffer into the particular segment within a selected module when it is determined at step a that the insertion of the buffer will not alter the number of ports of any one of the modules required to accommodate the net.

23. The computer-readable media in accordance with claim 22 wherein step a comprises the substep of determining whether any port is connected to the net both upstream and downstream of the particular segment.

24. The method in accordance with claim 21 wherein the steps a, b, and c and respective substeps thereof are implemented in software stored on computer-readable media to be read and executed by the system.

* * * * *